(12) United States Patent
Abuelma'Atti

(10) Patent No.: US 10,528,010 B2
(45) Date of Patent: Jan. 7, 2020

(54) RANGE FINDING DEVICE

(71) Applicant: KING FAHD UNIVERSITY OF PETROLEUM AND MINERALS, Dhahran (SA)

(72) Inventor: Muhammad Taher Abuelma'Atti, Dhahran (SA)

(73) Assignee: King Fahd University of Petroleum and Minerals, Dhahran (SA)

( * ) Notice: Subject to any disclaimer, the term of this patent is extended or adjusted under 35 U.S.C. 154(b) by 17 days.

(21) Appl. No.: 16/395,820

(22) Filed: Apr. 26, 2019

(65) Prior Publication Data

US 2019/0286065 A1   Sep. 19, 2019

Related U.S. Application Data

(63) Continuation of application No. 15/925,227, filed on Mar. 19, 2018.

(51) Int. Cl.
| | | |
|---|---|---|
| *H03M 1/12* | (2006.01) | |
| *G04F 10/10* | (2006.01) | |
| *G04F 10/00* | (2006.01) | |
| *H03K 4/08* | (2006.01) | |

(52) U.S. Cl.
CPC ............ *G04F 10/10* (2013.01); *G04F 10/005* (2013.01); *H03K 4/08* (2013.01); *H03M 1/12* (2013.01)

(58) Field of Classification Search
CPC ......... G04F 10/10; G04F 10/005; H03M 1/12
USPC ....................................................... 341/155
See application file for complete search history.

(56) References Cited

U.S. PATENT DOCUMENTS

| | | | |
|---|---|---|---|
| 4,679,160 A | | 7/1987 | Whitener |
| 4,750,117 A | | 6/1988 | Gregory |
| 5,124,597 A | * | 6/1992 | Stuebing ................ H03K 5/133 327/261 |
| 5,901,194 A | * | 5/1999 | Chevallier ............ H03M 1/822 327/172 |
| 6,754,613 B2 | | 6/2004 | Tabatabaei et al. |
| 6,956,422 B2 | | 10/2005 | Reilly et al. |
| 7,259,524 B2 | | 8/2007 | Hausman, Jr. |

(Continued)

OTHER PUBLICATIONS

G.S. Jovanovic, et al., "Vernier's Delay Line Time-to-Digital Converter", Scientific Publications of the State University of Novi Pazar: Ser. A: Appl. Math. Inform. and Mech., vol. 1, No. 1, 2009, pp. 11-20.

(Continued)

*Primary Examiner* — Jean B Jeanglaude
(74) *Attorney, Agent, or Firm* — Oblon, McClelland, Maier & Neustadt, L.L.P.

(57) ABSTRACT

A time-to-voltage converter (TVC) including a 555 timer integrated circuit (IC), and a charging circuit including a constant current source and a capacitor connected in series. The capacitor can be connected to a discharge pin of the 555 timer IC. The TVC can further include a trigger circuit and a reset circuit to receive a start signal and a stop signal, respectively, from an input line, and accordingly generate a trigger signal or a reset signal to trigger or reset the 555 timer IC. A switch can be configured to, under control of an output signal of the 555 timer IC, connect the input line with the reset circuit. A voltage across the capacitor when the 555 timer IC is reset indicates a time interval corresponding to the start and stop signals.

2 Claims, 3 Drawing Sheets

(56) References Cited

U.S. PATENT DOCUMENTS

| | | |
|---|---|---|
| 8,058,937 B2 | 11/2011 | Qin |
| 8,188,734 B1 | 5/2012 | Abuelma'Atti et al. |
| 8,614,595 B2 | 12/2013 | Acatrinei |
| 9,197,402 B2 | 11/2015 | Kim et al. |
| 2006/0038598 A1 | 2/2006 | Reilly et al. |
| 2008/0007711 A1 | 1/2008 | Liu |
| 2017/0194972 A1 | 7/2017 | Sai et al. |

OTHER PUBLICATIONS

Zule, Xu, et al., "Picosecond Resolution Time-to-Digital Converter Using $G_m$—C Integrator and SAR-ADC", IEEE Transactions on Nuclear Science, vol. 61, No. 2, Apr. 2014, pp. 852-859.

Jungho Kim, et al., "A Hybrid-Domain Two-Step Time-to-Digital Converter Using a Switch-Based Time-to-Voltage Converter and SAR ADC", IEEE Transactions on Circuits and Systems-II: Express Briefs, vol. 62, No. 7, Jul. 2015, pp. 631-635.

Jim Keith, "Edge-Triggered 555 Monostable Multivibrator", Electro Schematics, https://www.electroschematics.com/11032/edge-triggered-555-monostable-rnultivibrator/.

"555 Timer Ramp Generator", Making Easy Circuits, May 15, 2016, https://makingcircuits.com/blog/555-timer-ramp-generator/.

Wang Wei, et al., "Resolve picoseconds using FPGA techniques", EDN Network, Mar. 3, 2016, https://www.edn.com/design/integrated-circuit-design/4441555/Resolve-picoseconds-using-FPGA-techniques.

Neil P. Albaugh, "Time-to-Voltage Converter", Tinacloud, https://www.tinacloud.com/tinademo/tina.php?path=EXAMPLESROOT%7CUSER%7C&file=Time-to-Voltage%20Converter-YT.tsc.

* cited by examiner

RANGE FINDING DEVICE

CROSS-REFERENCE TO RELATED APPLICATIONS

The present application is a Continuation of Ser. No. 15/925,227, now allowed, having a tiling date of Mar. 19, 2018.

BACKGROUND

Field of the Disclosure

The present disclosure relates to circuits for measurement of time interval between two physical events, and specifically relates to time-to-voltage converters (TVCs) and time-to-digital converters (TDCs).

Description of the Related Art

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

The following references are related with the disclosure, and are incorporated by reference herein in their entirety:
J. Mahoney, Circuit converts pulse width voltage, EDN, Oct. 25, 2001, pp. 92-94;
D. A. Johnson, Pulse period to voltage converter, www.discovercircuits.com;
T. Xia, J.-C. Lo, Time-to-voltage converter for on-chip jitter measurement, IEEE Transactions on Instrumentation and Measurement, Vol. 52, 2003, pp. 1738-1748;
M. Rezvanyvardom, T. Ghanavati and E. Farshidi, A 5-bit time to digital converter using time to voltage conversion and integrating techniques for agricultural products analysis by Raman spectroscopy, Information Processing in Agriculture, Vol. 1, 2014, pp. 124-130;
N. Xing, H. Song, D.-K. Jeong and S. Kim, A PVT-insensitive time-to-digital converter using fractional difference Vernier delay lines, 2009 IEEE international SOC Conference (SOCC). pp. 43-46;
M. Koltai, Time-to-voltage converter, posted on Jun. 2, 2015, http://www.tina.com/blog/tag/time-to-voltage-converter-circuit/;
A. E. Stevens, R. P. Van Berg, J. V. Der Speigel and H. H. Williams, A time-to-voltage converter and analog memory for colliding beam detectors, IEEE Journal of Solid-State Circuits, Vol. 24, 1989, pp. 1748-1752;
E. Raisanen-Ruotsalainen, T. Rahkonen and J. Kostamovaara, A high resolution time-to-digital converter based on time-to-voltage based on time-to-voltage interpolation, Proceedings of the 23rd European Solid-State Circuits Conference. pp. 332-335;
S. Henzler, Time-to-Digital Converter Basics, Chapter 2, Springer Series in Advanced Microelectronics, pp. 5-18;
S. M. Hassan and S. Pervaiz, Design of a time-to-amplitude converter, Jul. 24, 2009, https://physlab.lums.edu.pk/images/6/63/Tac.pdf;
J. Kalisez, Review of methods for measurements with picoseconds resolution, Metrologia, Vol. 41, 2004, pp. 17-32;
P. Chen, C. C. Chen and Y. S. Shen, A low-cost low-power CMOS time-to-digital converter based on pulse stretching, IEEE Transactions on Nuclear Science, Vol. 53, 2006, pp. 2215-2220;
C. H. Jeomg, C. K. Kwon and I. C. Hwang, Low-power, wide-range time-yo-digital converter for all digital phase-locked loops, Electronics Letters, Vol. 49, 2013, pp. 96-97;
G. W. Roberts and M. Ali-Bakhshian, A brief introduction to time-to-digital and digital-to-time converters, IEEE Transactions on Circuits and Systems II: Express Briefs, Vol. 57, 2010, pp. 153-157;
M. Kim, H. Lee, J. K. Woo and N. Xing, A low-cost and low-power time-to-digital converter using triple-slope time stretching, IEEE Transactions on Circuits and Systems II: Express Briefs, Vol. 58, 2011, pp. 169-173;
P. Chen, C.-C. Chen, C.-C. Tsai and W.-F. Lu, A time-to-digital-converter-based CMOS smart temperature sensor, IEEE Journal of Solid-State Circuits, Vol. 40, 2005, pp. 1642-1648;
R. Hegler, Circuit converts pulse width to voltage, EDN, https://www.edn.com/;
K. Maatta and J. Kostamovaara, A high-precision time-to-digital converter for pulsed time-of-flight laser radar applications, IEEE Transactions on Instrumentation and Measurement, Vol. 47, 1998, pp. 521-536;
R. Nutt, Digital time intervalometer, Review of Scientific Instruments, Vol. 39, 1968, pp. 1342-1345;
E. Raisanen-Routsalainen, T. Rahkonen and J. Kostamovaara, A high resolution time-to-digital converter based on time-to-voltage interpolation, Proceedings of the 23rd European Solid-State Circuits Conference (ESSCIRC), 1997, pp. 332-335; and
E. Raisanen-Routsalainen, T. Rahkonen and J. Kostamovaara, An integrated time-to-digital converter 30-ps single-shot precision, IEEE Journal of Solid-State Circuits, Vol. 35, 2000, pp. 1507-1510.

Measurement of time interval between two physical events is widely used in many instrumentation, control and communication applications. Accordingly, electronic circuits for time-to-voltage converters (TVCs) and time-to-digital converters (TDCs) are continuously being developed. A TDC can be built around a TVC followed by an analog-to-digital converter (ADC). Over the years, various circuits were developed for TVC and TDC. Some of these circuits are used to convert a pulse duration to a voltage while others are used to convert the time interval between two pulses to a voltage. Some of the time interval to voltage converters has two inputs. Thus, the input is formed of two pulses generated on two separate wires; one applied to a START input of the TVC and the other is applied to a STOP input of the TVC. Moreover, while some of the TVCs or TDCs are built around digital circuits, others are built around analog circuits.

For example, the circuit presented in Mahoney (J. Mahoney, Circuit converts pulse width to voltage, EDN, Oct. 25, 2001, pp. 92-94) uses two operational amplifiers and a number of switches to configure integrator and sample-and-hold stages that convert the duration of a single pulse to a dc voltage. The circuit presented in Johnson (D. A. Johnson, Pulse period to voltage converter, www.discovercircuits.com) uses two operational amplifiers, a 555-timer, and a number of switches to convert a square wave input signal into a voltage that is proportional to the time between the edges (period) of the input signal, not its frequency. If the time between the edges of the pulse is decided by the START and STOP pulses, then the circuits can provide a TVC. The circuits proposed in Rezvany-vardom (M. Rezvanyvardom, T. Ghanavati and E. Farshidi, A 5-bit time to digital converter using time to voltage conversion and integrating techniques for agricultural products analysis by Raman spectroscopy, Information Processing in Agriculture, Vol. 1, 2014, pp. 124-130), Henzler (S. Henzler, Time-to-Digital Converter Basics, Chapter 2, Springer Series in Advanced Microelectronics, pp. 5-18), and Raisanen-Routsalainen (E. Raisanen-Routsalainen, T. Rahkonen and J. Kostamovaara, An integrated time-to-digital converter 30-ps single-shot precision, IEEE Journal of Solid-State Circuits, Vol. 35, 2000, pp. 1507-1510) use a charge pump circuit to charge a capacitor by a constant reference current. Then the voltage across the capacitor is converted to a digital output using a dual-integrator circuit.

The circuits proposed in Xing (N. Xing, H. Song, D.-K. Jeong and S. Kim, A PVT-insensitive time-to-digital converter using fractional difference Vernier delay lines, 2009 IEEE International SOC Conference (SOCC). pp. 43-46), Henzler (S. Henzler, Time-to-Digital Converter Basics, Chapter 2, Springer Series in Advanced Microelectronics, pp. 5-18), and Kalisez (J. Kalisez, Review of methods for time interval measurements with picoseconds resolution, Metrologia, Vol. 41, 2004, pp. 17-32) use a Vernier delay line formed of a number of D-type flip-flops (FFs) for TDC. The circuit proposed in Koltai (M. Koltai, Time-to-voltage converter, posted on Jun. 2, 2015, http://www.tina.com/blog/tag/time-to-voltage-converter-circuit/) uses a constant current source and two switches to start and stop the charging of capacitor. Then the voltage across the capacitor is taken via a voltage buffer. In the circuits reported in Stevens (A. E. Stevens. R. P. Van Berg, J. V. Der Speigel and H. H. Williams, A time-to-voltage converter and analog memory for colliding beam detectors, IEEE Journal of Solid-State Circuits, Vol. 24, 1989, pp. 1748-1752), Henzler (S. Henzler, Time-to-Digital Converter Basics, Chapter 2, Springer Series in Advanced Microelectronics, pp. 5-18), and Kalisez (J. Kalisez, Review of methods for time interval measurements with picoseconds resolution, Metrologia, Vol. 41, 2004, pp. 17-32), a constant current source is used to charge a capacitor during the period of a pulse generated by the START and STOP pulses. The circuit proposed in Raisanen-Ruotsalainen (E. Raisanen-Ruotsalainen, T. Rahkonen and J. Kostamovaara, A high resolution time-to-digital converter based on time-to-voltage based on time-to-voltage interpolation, Proceedings of the 23rd European Solid-State Circuits Conference. pp. 332-335) uses a constant current source to charge a capacitor during the time interval between the START and STOP pulses. The voltage across the capacitor is buffered and applied as input to an ADC.

The circuit proposed in Hassan (S. M. Hassan and S. Pervaiz, Design of a time-to-amplitude converter, Jul. 24, 2009, https://physlab.lums.edu.pk/images/6/63/Tac.pdf) uses a constant current source and a 555-timer to convert the duration of an input pulse to an output pulse whose amplitude is proportional to the duration of the input pulse. The circuit proposed in Hegler (R. Hegler, Circuit converts pulse width to voltage, EDN, https://www.edn.com/) converts the pulse width to voltage. The circuit operates similar to a phase-locked-loop, but it locks onto the pulse width, rather than to the frequency of the incoming signal. The circuit proposed in Roberts (G. W. Roberts and M. Ali-Bakhshian, A brief introduction to time-to-digital and digital-to-time converters, IEEE Transactions on Circuits and Systems Express Briefs, Vol. 57, 2010, pp. 153-157) uses a series of voltage-controlled delay units as primary building blocks.

The circuit proposed in Chen (P. Chen, C.-C. Chen, C.-C. Tsai and W.-F. Lu, A time-to-digital-converter-based CMOS smart temperature sensor, IEEE Journal of Solid-State Circuits, Vol. 40, 2005, pp. 1642-1648) uses a cyclic time-to-digital converter to convert the pulse into a corresponding digital code without recourse to ADCs. The circuits proposed in Maatta (K. Maatta and J. Kostamovaara, A high-precision time-to-digital converter for pulsed time-of-flight laser radar applications, IEEE Transactions on Instrumentation and Measurement, Vol. 47, 1998, pp. 521-536), and Raisanen-Routsalainen (E. Raisanen-Routsalainen, T. Rahkonen and J. Kostamovaara, A high resolution time-to-digital converter based on time-to-voltage interpolation, Proceedings of the 23rd European Solid-State Circuits Conference (ESSCIRC), 1997, pp. 332-335) use the START and STOP pulses to generate a pulse with duration equal to the time interval between the START and the STOP pulses. By applying this pulse to an integrator then to an ADC one can obtain a TDC. The circuit proposed in Nutt (R. Nutt, Digital time intervalometer, Review of Scientific Instruments, Vol. 39, 1968, pp. 1342-1345) is a fully digital counter-based TDC.

Conventional circuits either convert a pulse-width into a voltage, or measure the time interval between two START and STOP pulses generated on two separate wires. It appears that very little has been developed about TVC or TDC in which the START and STOP pulses are generated on the same wire. This mode of operation has the advantage of virtually zero offset error.

SUMMARY

Aspects of the disclosure provide a time-to-voltage converter (TVC). The TVC can include a 555 timer integrated circuit (IC), and a charging circuit including a constant current source and a capacitor connected in series. The capacitor can be connected to a discharge pin of the 555 timer IC. The TVC can further include a trigger circuit configured to receive a start signal from an input line, and generate a trigger signal corresponding to the start signal to trigger the 555 timer IC. The TVC can further include a reset circuit configured to receive a stop signal from the input line via a switch, and generate a reset signal corresponding to the stop signal to reset the 555 timer IC. The switch can be configured to, under control of an output signal of the 555 timer IC, connect the input line with the reset circuit when the 555 timer IC is enabled. A voltage across the capacitor when the 555 timer IC is reset indicates a time interval corresponding to the start and stop signals.

In an embodiment, the trigger signal corresponds to a voltage transition in the start signal, and the reset signal corresponds to a voltage transition in the stop signal. In one example, the trigger circuit includes a differentiator circuit, such as an RC differentiator circuit. In one example, the reset circuit includes a differentiator circuit, such as an RC differentiator circuit. In one example, the switch is implemented with an AND gate with output of the 555 timer IC and the input line as input.

In one example, the TVC can further includes an analog-to-digital converter (ADC) configured to convert a voltage across the capacitor to digital bits, and latches configured to store the digital bits when the 555 timer IC is reset.

Aspects of the disclosure provide a range finding device. The range finding device can include a light transmitter configured to transmit an optical pulse to a target, a receiver configured to receive the optical pulse and a reflected pulse corresponding to the transmitted optical pulse, and generate a start signal and a stop signal corresponding to the optical pulse and the reflected pulse, respectively, and a time-to-digital converter disclosed herein that is configured to receive the start and stop signals from the receiver at the input line, and generate digital bits indicating a flight time of the optical pulse between transmission of the optical pulse and reception of the reflective pulse.

In one example, the range finding device can further include a display device configured to receive the digital bits indicating the flight time of the optical pulse between transmission of the optical pulse and reception of the reflective pulse, and display a distance corresponding to the flight time of the optical pulse.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Aspects of the disclosure provide a time-to-voltage converter (TVC) based on a 555 timer integrated circuit (IC). In an embodiment, the TVC uses commercially available components, for example, one 555 timer IC, one AND gate, four capacitors, two resistors, and a constant-current source. Thus, the TVC has a simple structure and a low cost. In addition, the TVC is configured to convert a time interval between a start signal and a stop signal to a voltage. Both the start and the stop signals are received at the same input line.

Figure 1:
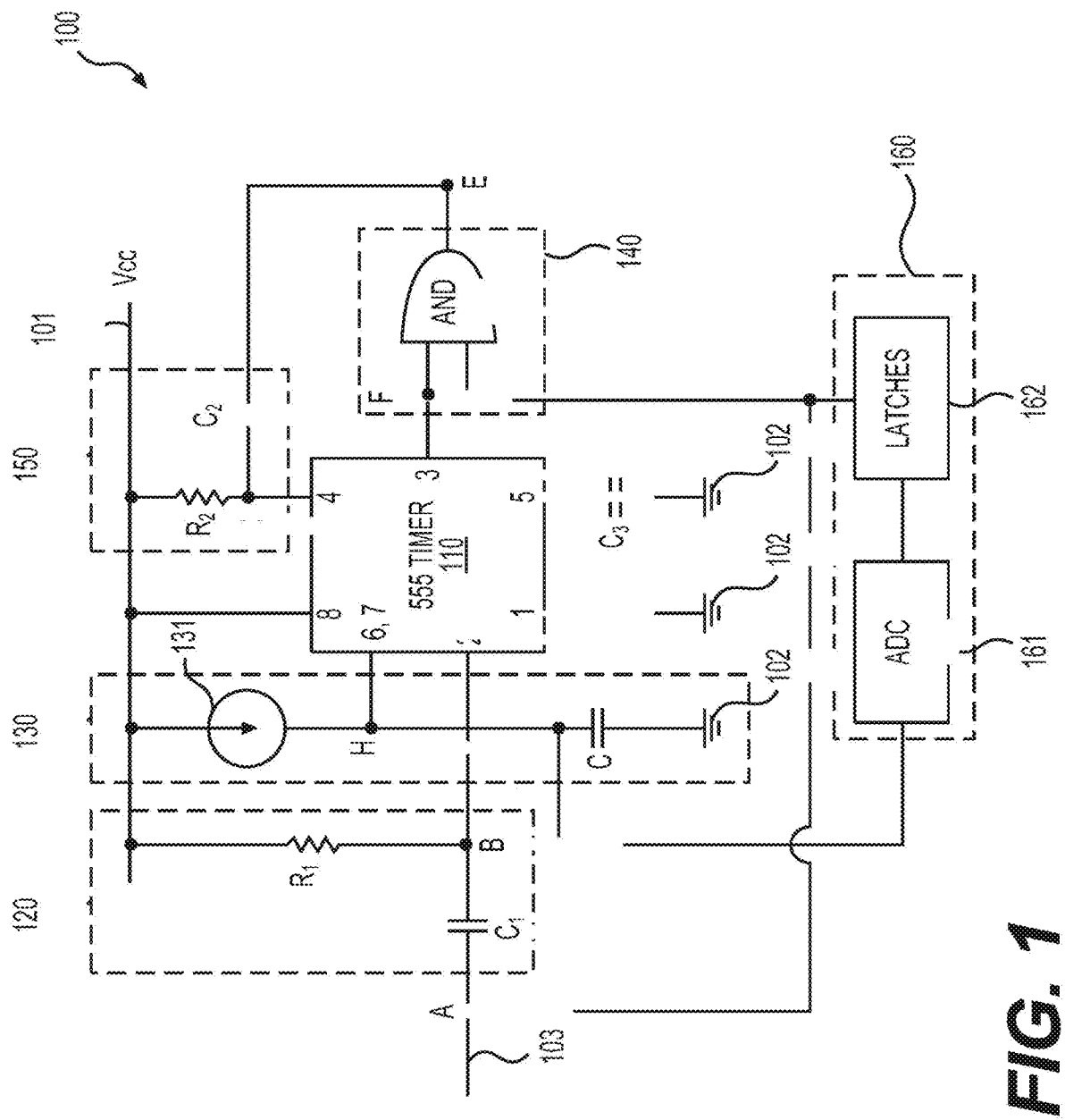
FIG. 1 shows a circuit diagram of an example time-to-voltage converter (TVC) according to embodiments of the disclosure.

FIG. 1 shows a circuit diagram of an example TVC 100 according to embodiments of the disclosure. The TVC 100 includes a 555 timer IC 110, a trigger circuit 120, a charging circuit 130, a switch 140, and a reset circuit 150. The TVC can additionally include an output circuit 160 in some examples. A set of nodes A, B, D, E, F, and H are also shown in FIG. 1.

The 555 timer IC 110 can include the following pins: pin 1-ground supply, pin 2-trigger, pin 3-output, pin 4-reset, pin 5-control, pin 6-threshold, pin 7-discharge, and pin 8-positive supply. The 555 timer IC 110 can be a product of various manufacturers. In FIG. 1 example, the pin 8 is connected to a power supply 101, and the pin 1 is connected to a ground 102. In addition, the pin 5 is connected to the ground 102 via a capacitor C3 that can filter noises between the power supply 101 and the ground 102.

The trigger circuit 120 can be a differentiator circuit, such as an active differentiator circuit or a passive differentiator circuit. In FIG. 1 example, the trigger circuit 120 is an RC differentiator circuit, and includes a capacitor C1, and a resistor R1. The trigger circuit 120 receives an input from an input line 103, and generates a trigger signal at the node B to trigger the 555 timer IC 110. The node A is on the input line 103. The node B is connected to the pin 2 of the 555 timer IC 110.

The charging circuit 130 is positioned between the power supply 101 and the ground 102. The charging circuit 130 includes a constant current source 131 generating a constant current I, and a capacitor C that is connected to the constant current source 131 in series. The node H between the constant current source 131 and the capacitor C is connected to the pin 6 and pin 7 of the 555 timer IC.

The switch 140 is configured to connect the input line 103 to the reset circuit 150 via the node E as an input to the reset circuit 150. The switch 140 is under the control of an output of the 555 timer IC from the pin 3. For example, when the output of 555 timer IC is of a high voltage, the switch 140 is closed, and the input line 103 is connected to the reset circuit 150. In contrast, when the output of 555 timer IC is of a low voltage, the switch 140 is opened, and the input line 103 is disconnected to the reset circuit 150. In FIG. 1 example, the switch 140 is implemented as an AND gate with the output pin 3 and the input line 103 as input.

The reset circuit 150 can be a differentiator circuit, such as an active differentiator circuit or a passive differentiator circuit. In FIG. 1 example, the reset circuit 150 is an RC differentiator circuit, and includes a capacitor C2, and a resistor R2. The reset circuit 150 is configured to receive an input from the input line 103 at the node E, and accordingly generate reset signal applied to the pin 4 to reset the 555 timer circuit 110.

Figure 2:
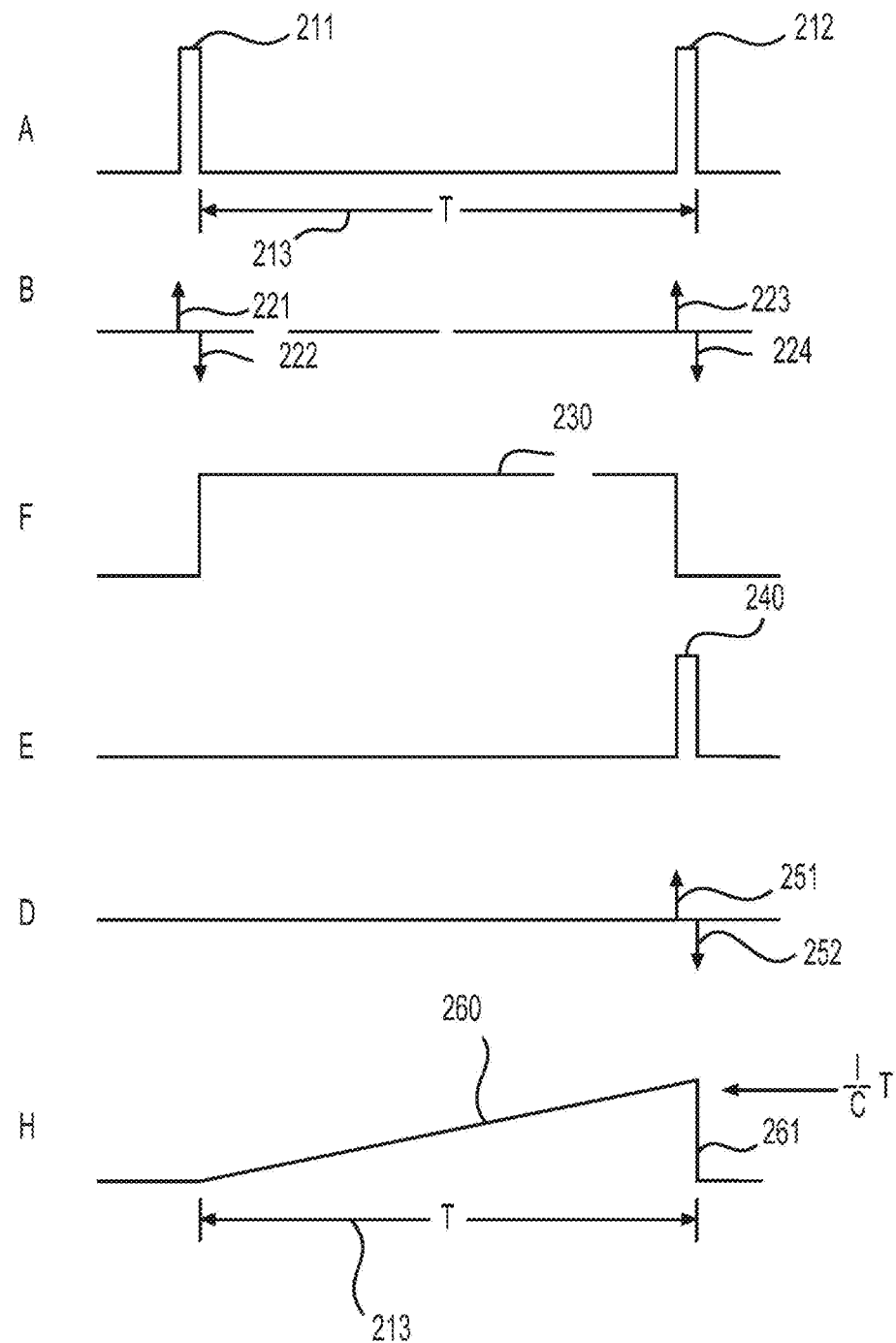
FIG. 2 shows waveforms of signals at nodes A, B, F, E, D, and H in the circuit diagram during a time interval measurement process of the TVC according to an example of the disclosure.

FIG. 2 shows waveforms of signals at the nodes A, B, F, E, D and H, respectively, during a time interval measurement process of the TVC 100 according to an example of the disclosure. During the measurement process, the TVC 100 receives an input at the node A that includes a start signal 211 and a stop signal 212, and translates a time interval T 213 between the start signal 211 and the stop signal 212 into a voltage 261 across the capacitor C.

Specifically, during the measurement process, the trigger circuit 120 can differentiates the start signal 211 to generate a positive spike signal 221 and a negative spike signal 222 at the node B. The spike signal 221 corresponds to a leading edge (a positive going voltage transition in FIG. 2) of the start signal 211, while the spike signal 222 corresponds to a trailing edge (a negative going voltage transition in FIG. 2) of the start signal 211. While the start and stop signals 211-212 are shown as narrow square pules in FIG. 2, the start and stop signals 211-222 can take other shapes in other examples, such as a triangle waveform, a saw-tooth waveform, sine waveform, and the like. Accordingly, output signals of the trigger circuit 120 can have a shape other than a spike.

The resulting spike signal 222 at the node B can pull down the voltage at the pin 2 of the 555 timer IC 110, thus triggering the 555 timer IC 110. As a result, a previously connected low resistance path between the pin 7 and the ground 102 within the 555 timer IC 110 is blocked. The capacitor C can start a charging process via the constant current source 131. The voltage 260 across the capacitor C at node H starts to increase linearly with time as shown in FIG. 2.

In the meantime, an output voltage the pin 3 (the node F) of the 555 timer IC 110 can form a pulse 230. The duration of this pulse 230 will be decided by the arrival of the stop signal 212. The start signal 211 is also applied to the AND gate. However, as long as the output of the 555 timer IC 110 at the node F is at a low voltage (logic 0), the AND gate will be disabled and its output will be logic 0 as shown in the waveform of the node E in FIG. 2. The 555 timer IC 110 continues to be enabled by a voltage applied at the pin 4.

When the stop signal 212 arrives at the input line 103, the stop signal 212 is differentiated by the trigger circuit 120 resulting in a positive spike signal 223 and a negative spike signal 224 at the node B. The resulting spike signal 224 pulls down the voltage at the pin 2 of the 555 timer IC 110, and the 555 timer IC 110 can be triggered. However, this trigger can be ignored as the 555 timer 110 is already enabled. The capacitor C can continues the charging.

The stop signal 212 can also appear at an input of the AND gate. With the other input of the AND gate connected to the output pulse 230 of the 555 timer IC, which is by now logic 1, the AND gate is in an enabled state, and produces an output corresponding to logic 1 at the node E. This output is in the form of a pulse 240. The duration of this pulse 240 is equal to the duration of the stop signal pulse 212.

The output pulse 240 of the AND gate can be applied to the trigger circuit 150. The trigger circuit 150 can accordingly generate a positive spike signal 251 and a negative spike signal 252. The resulting spike signal 252 can pull down the voltage at the pin 4 of the 555 timer IC, and disable (reset) the 555 timer IC 110. Accordingly, the previously blocked low resistance path connecting the pin 7 to the ground 102 can be reconnected, and the charging process of the capacitor C can be terminated. The final value 261 of the capacitor voltage 260 is given by, $$V_c = \frac{I}{C_c} T \quad (1)$$

where T is the time interval 213 between the start and the stop signals 211 and 212 as shown in FIG. 2, $C_C$ represents the capacitance of the capacitor C, I is the constant current provided by the constant current source 131, and $V_C$ represents the voltage output of the TVC 100 that is proportional to T, or the time interval 213.

In one example, a time-to-digital converter (TDC) can be obtained by applying the voltage 260 across the capacitor C to the output circuit 160. The output circuit 160 can include an analog-to-digital converter (ADC) 161 and a set of latches 162 connected to output of the ADC 161. During the charging process of the capacitor C, the ADC 161 can produce output digital bits, however the output digital bits are not available at the latches 162 until the set of latches 162 are enabled. For example, the latches 162 can be enabled by the negative going edge of the stop signal and subsequently stores the output digital bits of the ADC 161. The stored digital bits can then be used as an output of the TDC.

Figure 3:
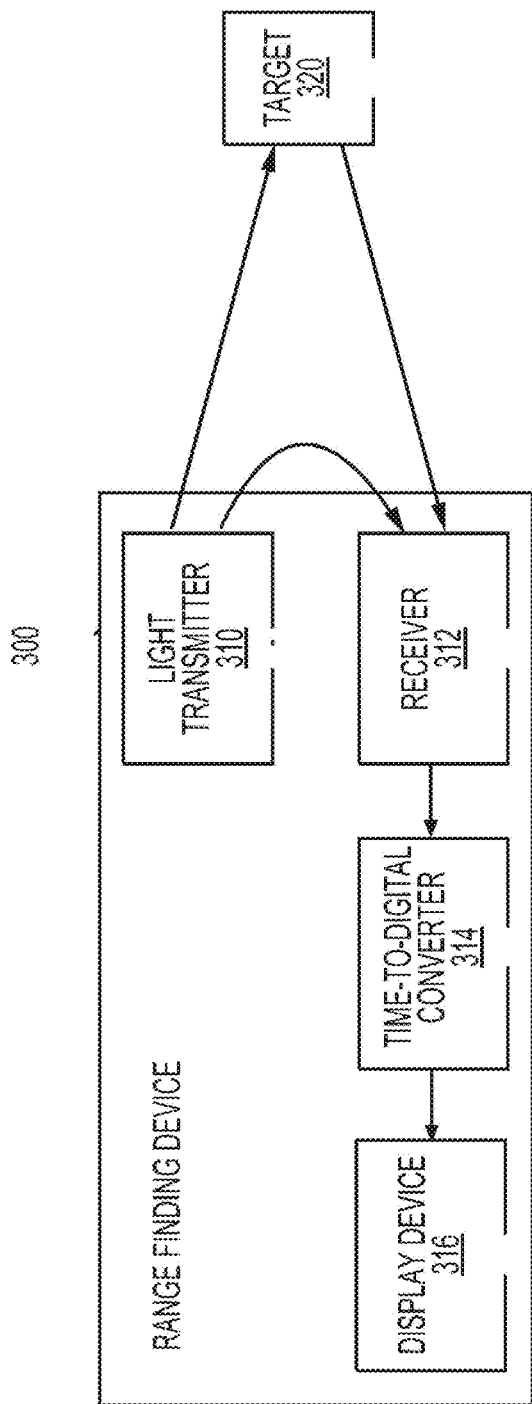
FIG. 3 shows a range finding device according to an embodiment of the disclosure.

The TVC and TDC circuits disclosed herein can be employed in various applications, such as autonomous vehicles, consumer electronics, measurements in high-energy physics, and the like. As an example, FIG. 3 shows a range finding device (RFD) 300 according to an embodiment of the disclosure. The RFD 300 can include a light transmitter 310, a receiver 312, a TDC 314, and a display device 316. Those components are coupled together as shown in FIG. 3.

The RFD 300 can be configured to measure a flight time of an optical pulse from the light transmitter 310 to a target 320 and back to the receiver 312, and calculate a distance according to the measured flight time and the known velocity of light.

The light transmitter 310 can be configured to transmit an optical pulse to a target. For example, the light transmitter 310 can include a semiconductor laser diode. The semiconductor diode can be configured to transmit a short optical pulse (e.g., 2-6 ns) to the target. The short optical pulse can be reflected from the target, and a reflected optical pulse can accordingly be generated.

The receiver 312 can be configured to receive the optical pulse and the reflected pulse at different times, and generate a start signal and a stop signal corresponding to the optical pulse and the reflected pulse, respectively. For example, the receiver 312 can include an optical detector that is optically coupled to the light transmitter 310. Accordingly, the optical detector can detect transmission of the optical pulse, and generate a first timing signal corresponding to the transmission of the optical pulse. In addition, the optical detector can also receive and detect the reflected optical pulse, and generate a second timing signal corresponding to reception of the reflected pulse. The receiver 312 can further include one or more amplifiers that amplify the first and second timing signals to generate the start and stop signals, respectively.

The TDC 314 is configured to receive the start and stop signals from the receiver 312, and accordingly generate digital bits indicating a flight time of the optical pulse between transmission of the optical pulse and reception of the reflected pulse. The TDC 314 can employ the TVC and/or TDC circuits disclose herein to measure the flight time of the optical pulse. Particularly, the start and stop signals can be received at a same input line of the TDC 314.

The display device 316 can be configured to display a distance corresponding to the digital bits indicating the flight time of the optical pulse. For example, based on the measured flight time and the velocity of light, the display device 316 may first calculate a distance between the RFD 300 and the target 320, and then display the distance to an output device, such as a touch panel screen.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. A range finding device, comprising:
a power supply;
a ground;
a light transmitter configured to transmit an optical pulse to a target;
a receiver configured to receive the optical pulse and a reflected pulse corresponding to the transmitted optical pulse, and generate a start signal and a stop signal corresponding to the optical pulse and the reflected pulse, respectively; and
a time-to-voltage converter (TVC) configured to receive the start and stop signals from the receiver at the input line, and generate digital bits indicating a flight time of the optical pulse between transmission of the optical pulse and reception of the reflective pulse, wherein the TVC comprises:
a 555 timer integrated circuit (IC);
a charging circuit including a constant current source and a first capacitor connected in series, the first capacitor being connected to a discharge pin and a threshold pin of the 555 timer IC;
a second capacitor connected to a control pin of the 555 timer IC configured to filter noise between the power supply and the ground;

a trigger circuit including an RC differentiator circuit and configured to,
receive a start signal from an input line, and
generate a trigger signal corresponding to a voltage transition in the start signal to trigger the 555 timer IC;
a reset circuit including an RC differentiator circuit and configured to,
receive a stop signal from the input line via an AND gate, and
generate a reset signal corresponding to the stop signal to reset the 555 timer IC; and
the AND gate with output of the 555 timer IC and the input line as input,
wherein a voltage across the first capacitor indicates a time interval corresponding to the start and stop signals.

2. The range finding device of claim 1, further comprising:
a display device configured to receive the digital bits indicating the flight time of the optical pulse between transmission of the optical pulse and reception of the reflective pulse, and display a distance corresponding to the flight time of the optical pulse.

\* \* \* \* \*